US009107010B2

(12) United States Patent
Abdollahzadeh Milani

(10) Patent No.: US 9,107,010 B2
(45) Date of Patent: Aug. 11, 2015

(54) AMBIENT NOISE ROOT MEAN SQUARE (RMS) DETECTOR

(71) Applicant: Cirrus Logic, Inc., Austin, TX (US)

(72) Inventor: Ali Abdollahzadeh Milani, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 366 days.

(21) Appl. No.: 13/762,504

(22) Filed: Feb. 8, 2013

(65) Prior Publication Data

US 2014/0226827 A1 Aug. 14, 2014

(51) Int. Cl.

*H04R 29/00* (2006.01)
*H03G 3/00* (2006.01)

(Continued)

(52) U.S. Cl.

CPC ............ *H04R 29/00* (2013.01); *G10K 11/1788* (2013.01); *G10L 21/0224* (2013.01); *H04R 29/004* (2013.01); *G10K 2210/108* (2013.01); *G10K 2210/3023* (2013.01)

(58) Field of Classification Search

CPC .... H04R 29/00; H04R 29/001; H04R 29/002; H04R 29/003; H04R 29/004; H04R 29/005; H04R 29/006; H04R 29/007; H04R 29/008; G10L 21/0224; G10K 11/1788; G10K 2210/108; G10K 2210/3023

USPC ...................................................... 381/56, 57

See application file for complete search history.

(56) References Cited

U.S. PATENT DOCUMENTS 5,251,263 A 10/1993 Andrea et al.
5,278,913 A 1/1994 Delfosse et al.

(Continued)

FOREIGN PATENT DOCUMENTS

DE 102011013343 A1 9/2012
EP 1880699 A2 1/2008

(Continued)

OTHER PUBLICATIONS

Kates, James M., "Principles of Digital Dynamic Range Compression," Trends in Amplification, Spring 2005, pp. 45-76, vol. 9, No. 2, Sage Publications.*

(Continued)

*Primary Examiner* — Matthew Eason
*Assistant Examiner* — Sean H Nguyen
(74) *Attorney, Agent, or Firm* — Robert Platt Bell; Steven Lin

(57) ABSTRACT

An RMS detector uses the concept of the k-NN (classifying using nearest neighbors)—algorithm in order to obtain RMS values. A rms detector using first-order regressor with a variable smoothing factor is modified to penalize samples from center of data in order to obtain RMS values. Samples which vary greatly from the background noise levels, such as speech, scratch, wind and other noise spikes, are dampened in the RMS calculation. When background noise changes, the system will track the changes in background noise and include the changes in the calculation of the corrected RMS value. A minimum tracker runs more often (e.g. two or three times) than the rate as in prior art detectors and methods, tracks the minimum rms value, which is to compute a normalized distance value, which in turn is used to normalize the smoothing factor. From this data, a corrected or revised RMS value is determined as the function of the previous RMS value multiplied by one minus the smoothing factor plus the smooth factor times the minimum rms value to output the corrected RMS for the present invention. The rms value is used to generate a reset signal for the minimum tracker and is used to avoid deadlock in the tracker, for example, when the background signal increases/decreases over time.

32 Claims, 7 Drawing Sheets

(51) Int. Cl.
*G10L 21/0224* (2013.01)
*G10K 11/178* (2006.01)

(56) References Cited

U.S. PATENT DOCUMENTS 5,321,759 A 6/1994 Yuan
5,337,365 A 8/1994 Hamabe et al.
5,359,662 A 10/1994 Yuan et al.
5,410,605 A 4/1995 Sawada et al.
5,425,105 A 6/1995 Lo et al.
5,445,517 A 8/1995 Kondou et al.
5,465,413 A 11/1995 Enge et al.
5,548,681 A 8/1996 Gleaves et al.
5,586,190 A 12/1996 Trantow et al.
5,640,450 A 6/1997 Watanabe
5,699,437 A 12/1997 Finn
5,706,344 A 1/1998 Finn
5,740,256 A 4/1998 Castello Da Costa et al.
5,768,124 A 6/1998 Stothers et al.
5,815,582 A 9/1998 Claybaugh et al.
5,832,095 A 11/1998 Daniels
5,946,391 A 8/1999 Dragwidge et al.
5,991,418 A 11/1999 Kuo
6,041,126 A 3/2000 Terai et al.
6,118,878 A 9/2000 Jones
6,219,427 B1 4/2001 Kates et al.
6,278,786 B1 8/2001 McIntosh
6,282,176 B1 8/2001 Hemkumar
6,418,228 B1 7/2002 Terai et al.
6,434,246 B1 8/2002 Kates et al.
6,434,247 B1 8/2002 Kates et al.
6,522,746 B1 2/2003 Marchok et al.
6,683,960 B1 1/2004 Fujii et al.
6,766,292 B1 7/2004 Chandran
6,768,795 B2 7/2004 Feltstrom et al.
6,850,617 B1 2/2005 Weigand
6,940,982 B1 9/2005 Watkins
7,103,188 B1 9/2006 Jones
7,181,030 B2 2/2007 Rasmussen et al.
7,330,739 B2 2/2008 Somayajula
7,365,669 B1 4/2008 Melanson
7,680,456 B2 3/2010 Muhammad et al.
7,742,790 B2 6/2010 Konchitsky et al.
7,817,808 B2 10/2010 Konchitsky et al.
8,019,050 B2 9/2011 Mactavish et al.
8,249,262 B2 8/2012 Chua et al.
8,290,537 B2 10/2012 Lee et al.
8,325,934 B2 12/2012 Kuo
8,379,884 B2 2/2013 Horibe et al.
8,401,200 B2 3/2013 Tiscareno et al.
8,442,251 B2 5/2013 Jensen et al.
2001/0053228 A1 12/2001 Jones
2002/0003887 A1 1/2002 Zhang et al.
2003/0063759 A1 4/2003 Brennan et al.
2003/0185403 A1 10/2003 Sibbald
2004/0047464 A1 3/2004 Yu et al.
2004/0165736 A1 8/2004 Hetherington et al.
2004/0167777 A1 8/2004 Hetherington et al.
2004/0202333 A1 10/2004 Csermak et al.
2004/0264706 A1 12/2004 Ray et al.
2005/0004796 A1 1/2005 Trump et al.
2005/0018862 A1 1/2005 Fisher
2005/0117754 A1 6/2005 Sakawaki
2005/0207585 A1 9/2005 Christoph
2005/0240401 A1 10/2005 Ebenezer
2006/0035593 A1 2/2006 Leeds
2006/0069556 A1 3/2006 Nadjar et al.
2006/0153400 A1 7/2006 Fujita et al.
2007/0030989 A1 2/2007 Kates
2007/0033029 A1 2/2007 Sakawaki
2007/0038441 A1 2/2007 Inoue et al.
2007/0047742 A1* 3/2007 Taenzer et al. .................. 381/92
2007/0053524 A1 3/2007 Haulick et al.
2007/0076896 A1 4/2007 Hosaka et al.
2007/0154031 A1 7/2007 Avendano et al.
2007/0258597 A1 11/2007 Rasmussen et al.
2007/0297620 A1 12/2007 Choy
2008/0019548 A1 1/2008 Avendano
2008/0101589 A1 5/2008 Horowitz et al.
2008/0107281 A1 5/2008 Togami et al.
2008/0144853 A1 6/2008 Sommerfeldt et al.
2008/0177532 A1 7/2008 Greiss et al.
2008/0181422 A1 7/2008 Christoph
2008/0226098 A1 9/2008 Haulick et al.
2008/0240455 A1 10/2008 Inoue et al.
2008/0240457 A1 10/2008 Inoue et al.
2009/0012783 A1 1/2009 Klein
2009/0034748 A1 2/2009 Sibbald
2009/0041260 A1 2/2009 Jorgensen et al.
2009/0046867 A1 2/2009 Clemow
2009/0060222 A1 3/2009 Jeong et al.
2009/0080670 A1 3/2009 Solbeck et al.
2009/0086990 A1 4/2009 Christoph
2009/0175466 A1 7/2009 Elko et al.
2009/0196429 A1 8/2009 Ramakrishnan et al.
2009/0220107 A1 9/2009 Every et al.
2009/0238369 A1 9/2009 Ramakrishnan et al.
2009/0245529 A1 10/2009 Asada et al.
2009/0254340 A1 10/2009 Sun et al.
2009/0290718 A1 11/2009 Kahn et al.
2009/0296965 A1 12/2009 Kojima
2009/0304200 A1 12/2009 Kim et al.
2009/0311979 A1 12/2009 Husted et al.
2010/0014683 A1 1/2010 Maeda et al.
2010/0014685 A1 1/2010 Wurm
2010/0061564 A1 3/2010 Clemow et al.
2010/0069114 A1 3/2010 Lee et al.
2010/0082339 A1 4/2010 Konchitsky et al.
2010/0098263 A1 4/2010 Pan et al.
2010/0124335 A1 5/2010 Wessling et al.
2010/0124336 A1 5/2010 Shridhar et al.
2010/0124337 A1 5/2010 Wertz et al.
2010/0150367 A1 6/2010 Mizuno
2010/0158330 A1 6/2010 Guissin et al.
2010/0166203 A1 7/2010 Peissig et al.
2010/0195838 A1 8/2010 Bright
2010/0195844 A1 8/2010 Christoph et al.
2010/0246855 A1 9/2010 Chen
2010/0266137 A1 10/2010 Sibbald et al.
2010/0272276 A1 10/2010 Carreras et al.
2010/0272283 A1 10/2010 Carreras et al.
2010/0274564 A1 10/2010 Bakalos et al.
2010/0284546 A1 11/2010 De Brunner et al.
2010/0291891 A1 11/2010 Ridgers et al.
2010/0296666 A1 11/2010 Lin
2010/0296668 A1 11/2010 Lee et al.
2010/0310086 A1 12/2010 Magrath et al.
2010/0322430 A1 12/2010 Isberg
2011/0007907 A1 1/2011 Park et al.
2011/0106533 A1 5/2011 Yu
2011/0129098 A1 6/2011 Delano et al.
2011/0130176 A1 6/2011 Magrath et al.
2011/0142247 A1 6/2011 Fellers et al.
2011/0144984 A1 6/2011 Konchitsky
2011/0158419 A1 6/2011 Theverapperuma et al.
2011/0206214 A1 8/2011 Christoph et al.
2011/0222698 A1 9/2011 Asao et al.
2011/0249826 A1 10/2011 Van Leest
2011/0288860 A1 11/2011 Schevciw et al.
2011/0293103 A1 12/2011 Park et al.
2011/0299695 A1 12/2011 Nicholson
2011/0305347 A1 12/2011 Wurm
2011/0317848 A1 12/2011 Ivanov et al.
2012/0135787 A1 5/2012 Kusunoki et al.
2012/0140917 A1 6/2012 Nicholson et al.
2012/0140942 A1 6/2012 Loeda
2012/0140943 A1 6/2012 Hendrix et al.
2012/0148062 A1 6/2012 Scarlett et al.
2012/0155666 A1 6/2012 Nair
2012/0170766 A1 7/2012 Alves et al.
2012/0207317 A1 8/2012 Abdollahzadeh Milani et al.
2012/0215519 A1 8/2012 Park et al.
2012/0250873 A1 10/2012 Bakalos et al.
2012/0259626 A1 10/2012 Li et al.

(56) References Cited

U.S. PATENT DOCUMENTS

| | | | |
|---|---|---|---|
| 2012/0263317 | A1 | 10/2012 | Shin et al. |
| 2012/0300958 | A1 | 11/2012 | Klemmensen |
| 2012/0300960 | A1 | 11/2012 | Mackay et al. |
| 2012/0308021 | A1 | 12/2012 | Kwatra et al. |
| 2012/0308024 | A1 | 12/2012 | Alderson et al. |
| 2012/0308025 | A1 | 12/2012 | Hendrix et al. |
| 2012/0308026 | A1 | 12/2012 | Kamath et al. |
| 2012/0308027 | A1 | 12/2012 | Kwatra |
| 2012/0308028 | A1 | 12/2012 | Kwatra et al. |
| 2012/0310640 | A1 | 12/2012 | Kwatra et al. |
| 2013/0010982 | A1 | 1/2013 | Elko et al. |
| 2013/0083939 | A1 | 4/2013 | Fellers et al. |
| 2013/0243198 | A1 * | 9/2013 | Van Rumpt ..................... 381/13 |
| 2013/0243225 | A1 | 9/2013 | Yokota |
| 2013/0272539 | A1 | 10/2013 | Kim et al. |
| 2013/0287218 | A1 | 10/2013 | Alderson et al. |
| 2013/0287219 | A1 | 10/2013 | Hendrix et al. |
| 2013/0301842 | A1 | 11/2013 | Hendrix et al. |
| 2013/0301846 | A1 | 11/2013 | Alderson et al. |
| 2013/0301847 | A1 | 11/2013 | Alderson et al. |
| 2013/0301848 | A1 | 11/2013 | Zhou et al. |
| 2013/0301849 | A1 * | 11/2013 | Alderson et al. ........... 381/71.11 |
| 2013/0343556 | A1 | 12/2013 | Bright |
| 2013/0343571 | A1 | 12/2013 | Rayala et al. |
| 2014/0044275 | A1 | 2/2014 | Goldstein et al. |
| 2014/0050332 | A1 | 2/2014 | Nielsen et al. |
| 2014/0086425 | A1 | 3/2014 | Jensen et al. |
| 2014/0177851 | A1 | 6/2014 | Kitazawa et al. |
| 2015/0010403 | A1 | 4/2015 | Kwatra et al. |
| 2015/0092953 | A1 | 4/2015 | Abdollahzadeh Milani et al. |

FOREIGN PATENT DOCUMENTS

| | | | |
|---|---|---|---|
| EP | 1947642 | A1 | 7/2008 |
| EP | 2133866 | A1 | 12/2009 |
| EP | 2216774 | A1 | 8/2011 |
| EP | 2395500 | A1 | 12/2011 |
| EP | 2395501 | A1 | 12/2011 |
| GB | 2401744 | A1 | 11/2004 |
| GB | 2455821 | A1 | 6/2009 |
| GB | 2455824 | A1 | 6/2009 |
| GB | 2455828 | A1 | 6/2009 |
| GB | 2484722 | A | 4/2012 |
| JP | H06-186985 | A1 | 7/1994 |
| WO | 03015074 | A2 | 2/2003 |
| WO | WO03015275 | A1 | 2/2003 |
| WO | WO2004009007 | A1 | 1/2004 |
| WO | WO2004017303 | A1 | 2/2004 |
| WO | 2007007916 | A1 | 1/2007 |
| WO | 2007113487 | A1 | 11/2007 |
| WO | 2010117714 | A1 | 10/2010 |
| WO | 2012134874 | A1 | 10/2012 |

OTHER PUBLICATIONS

James G. Ryan, Rafik A. Goubran, "Optimum near-field performance of microphone arrays subject to a far-field beampattern constraint", 2248 J. Acoust. Soc. Am. 108, Nov. 2000.

I. Cohen, B. Berdugo, "Noise Estimation by Minima Controlled Recursive Averaging for Robust Speech Enhancement", IEEE Signal Processing Letters, vol. 9, No. 1, Jan. 2002.

R. Martin, "Noise Power Spectral Density Estimation Based on Optimal Smoothing and Minimum Statistics", IEEE Trans. on Speech and Audio Processing, Col. 9, No. 5, Jul. 2001.

R. Martin, "Spectral Subtraction Based on Minimum Statistics", Proc. 7th EUSIPCO '94, Edinburgh, U.K., Sep. 13-16, 1994, pp. 1182-1195.

I. Cohen, "Noise Spectrum Estimation in Adverse Environments: Improved Minima Controlled Recursive Averaging", IEEE Trans. on Speech & Audio Proc., vol. 11, Issue 5, Sep. 2003.

A.A. Miliani, G. Kannan, and I.M.S. Panahi, "On maximum achievable noise reduction in ANC systems", in Proc. ICASSP, 2010, pp. 349-352, Mar. 2010.

Jin, et al. "A simultaneous equation method-based online secondary path modeling algorithm for active noise control", Journal of Sound and Vibration, Apr. 25, 2007, pp. 455-474, vol. 303, No. 3-5, London, GB.

International Search Report and Written Opinion of the International Searching Authority, International Patent Application No. PCT/US2014/017343, mailed Aug. 8, 2014, 22 pages.

International Search Report and Written Opinion of the International Searching Authority, International Patent Application No. PCT/US2014/018027, mailed Sep. 4, 2014, 14 pages.

International Search Report and Written Opinion of the International Searching Authority, International Patent Application No. PCT/US2014/017374, mailed Sep. 8, 2014, 13 pages.

International Search Report and Written Opinion of the International Searching Authority, International Patent Application No. PCT/US2014/019395, mailed Sep. 9, 2014, 14 pages.

International Search Report and Written Opinion of the International Searching Authority, International Patent Application No. PCT/US2014/019469, mailed Sep. 12, 2014, 13 pages.

Feng, Jinwei et al., "A broadband self-tuning active noise equaliser", Signal Processing, Elsevier Science Publishers B.V. Amsterdam, NL, vol. 62, No. 2, Oct. 1, 1997, pp. 251-256.

Zhang, Ming et al., "A Robust Online Secondary Path Modeling Method with Auxiliary Noise Power Scheduling Strategy and Norm Constraint Manipulation", IEEE Transactions on Speech and Audio Processing, IEEE Service Center, New York, NY, vol. 11, No. 1, Jan. 1, 2003.

Lopez-Gaudana, Edgar et al., "A hybrid active noise cancelling with secondary path modeling", 51st Midwest Symposium on Circuits and Systems, 2008, MWSCAS 2008, Aug. 10, 2008, pp. 277-280.

Widrow, B. et al., Adaptive Noise Cancelling; Principles and Applications, Proceedings of the IEEE, IEEE, New York, NY, U.S. vol. 63, No. 13, Dec. 1975, pp. 1692-1716.

Morgan, Dennis R. et al., A Delayless Subband Adaptive Filter Architecture, IEEE Transactions on Signal Processing, IEEE Service Center, New York, New York. US, vol. 43, No. 8, Aug. 1995, pp. 1819-1829.

International Search Report and Written Opinion of the International Searching Authority, International Patent Application No. PCT/US2014/040999, mailed Oct. 18, 2014, 12 pages.

International Search Report and Written Opinion of the International Searching Authority, International Patent Application No. PCT/US2034/049407, mailed Jun. 18, 2914, 13 pages.

Campbell, Mikey, "Apple looking into self-adjusting earbud headphones with noise cancellation tech", Apple Insider, Jul. 4, 2013, pp. 1-10 (10 pages in pdf), downloaded on May 14, 2014 from http://appleinsider.com/articles/13/07/04/apple-looking-into-self-adjusting-earbud-headphones-with-noise-cancellation-tech.

Erkelens et al., "Tracking of Nonstationary Noise Based on Data-Driven Recursive Noise Power Estimation", IEEE Transactions on Audio Speech, and Language Processing, vol. 16, No. 6, Aug. 2008.

Rao et al., "A Novel Two Stage Single Channle Speech Enhancement Technique", India Conference (INDICON) 2011 Annual IEEE, IEEE, Dec. 15, 2011.

Rangachari et al., "A noise-estimation algorithm for highly non-stationary environments" Speech Communication, Elsevier Science Publishers, vol. 48, No. 2, Feb. 1, 2006.

Hurstm et al., "An improved double sampling scheme for switched-capacitator delta-sigma modulators", 1992 IEEE Int. Symp. on Circuits and Systems, May 10-13, 1992, vol. 3, pp. 1179-1182, San Diego, CA.

Senderowicz, et al., "Low-Voltage Double-Sampled Delta-Sigma Converters", IEEE Journal on Solid-State Circuits, Dec. 1997, pp. 1907-1919, vol. 32, No. 12, Piscataway, NJ.

Lopez-Caudana, Edgar Omar, "Active Noise Cancellation: The Unwanted Signal and the Hybrid Solution", Adaptive Filtering Applications, Dr. Lino Garcia (Ed.), Jul. 2011, pp. 49-84, ISBN: 978-953-307-306-4, InTech.

Kuo, et al., "Residual noise shaping technique for active noise control systems", J. Acoust. Soc. Am. 95 (3), Mar. 1994, pp. 1665-1668.

(56) References Cited

OTHER PUBLICATIONS

Booij, et al., “Virtual sensors for local, three dimensional, broadband multiple-channel active noise control and the effects on the quiet zones”, Proceedings of the International Conference on Noise and Vibration Engineering, ISMA 2010, Sep. 20-22, 2010, pp. 151-166, Leuven.
Black, John W., “An Application of Side-Tone in Subjective Tests of Microphones and Headsets”, Project Report No. NM 001 064.01.20, Research Report of the U.S. Naval School of Aviation Medicine, Feb. 1, 1954, 12 pages. (pp. 1-12 in pdf), Pensacola, FL, US.
Peters, Robert W., “The Effect of High-Pass and Low-Pass Filtering of Side-Tone Upon Speaker Intelligibility”, Project Report No. NM 001 064.01.25, Research Report of the U.S. Naval School of Aviation Medicine, Aug. 16, 1954, 13 pages. (pp. 1-13 in pdf), Pensacola, FL, US.
Lane, et al., “Voice Level: Autophonic Scale, Perceived Loudness, and the Effects of Sidetone”, The Journal of the Acoustical Society of America, Feb. 1961, pp. 160-167, vol. 33, No. 2., Cambridge, MA, US.
Liu, et al., “Compensatory Responses to Loudness-shifted Voice Feedback During Production of Mandarin Speech”, Journal of the Acoustical Society of America, Oct. 2007, pp. 2405-2412, vol. 122, No. 4.
Paepcke, et al., “Yelling in the Hall: Using Sidetone to Address a Problem with Mobile Remote Presence Systems”, Symposium on User Interface Software and Technology, Oct. 16-19, 2011, 10 pages. (pp. 1-10 in pdf), Santa Barbara, CA, US.
Therrien, et al., “Sensory Attenuation of Self-Produced Feedback: The Lombard Effect Revisited”, PLOS ONE, Nov. 2012, pp. 1-7, vol. 7, Issue 11, e49370, Ontario, Canada.
Toochinda, et al. “A Single-Input Two-Output Feedback Formulation for ANC Problems,” Proceedings of the 2001 American Control Conference, Jun. 2001, pp. 923-928, vol. 2, Arlington, VA.
Kuo, et al., “Active Noise Control: A Tutorial Review,” Proceedings of the IEEE, Jun. 1999, pp. 943-973, vol. 87, No. 6, IEEE Press, Piscataway, NJ.
Johns, et al., “Continuous-Time LMS Adaptive Recursive Filters,” IEEE Transactions on Circuits and Systems, Jul. 1991, pp. 769-778, vol. 38, No. 7, IEEE Press, Piscataway, NJ.
Shoval, et al., “Comparison of DC Offset Effects in Four LMS Adaptive Algorithms,” IEEE Transactions on Circuits and Systems II: Analog and Digital Processing, Mar. 1995, pp. 176-185, vol. 42, Issue 3, IEEE Press, Piscataway, NJ.
Mali, Dilip, “Comparison of DC Offset Effects on LMS Algorithm and its Derivatives,” International Journal of Recent Trends in Engineering, May 2009, pp. 323-328, vol. 1, No. 1, Academy Publisher.
Gao, et al., “Adaptive Linearization of a Loudspeaker,” IEEE International Conference on Acoustics, Speech, and Signal Processing, Apr. 14-17, 1991, pp. 3589-3592, Toronto, Ontario, CA.
Silva, et al., “Convex Combination of Adaptive Filters With Different Tracking Capabilities,” IEEE International Conference on Acoustics, Speech, and Signal Processing, Apr. 15-20, 2007, pp. III 925-928, vol. 3, Honolulu, HI, USA.
Akhtar, et al., “A Method for Online Secondary Path Modeling in Active Noise Control Systems,” IEEE International Symposium on Circuits and Systems, May 23-26, 2005, pp. 264-267, vol. 1, Kobe, Japan.
Davari, et al., “A New Online Secondary Path Modeling Method for Feedforward Active Noise Control Systems,” IEEE International Conference on Industrial Technology, Apr. 21-24, 2008, pp. 1-6, Chengdu, China.
Lan, et al., “An Active Noise Control System Using Online Secondary Path Modeling With Reduced Auxiliary Noise,” IEEE Signal Processing Letters, Jan. 2002, pp. 16-18, vol. 9, Issue 1, IEEE Press, Piscataway, NJ.
Liu, et al., “Analysis of Online Secondary Path Modeling With Auxiliary Noise Scaled by Residual Noise Signal,” IEEE Transactions on Audio, Speech and Language Processing, Nov. 2010, pp. 1978-1993, vol. 18, Issue 8, IEEE Press, Piscataway, NJ.
Pfann, et al., “LMS Adaptive Filtering with Delta-Sigma Modulated Input Signals”, IEEE Signal Processing Letters, vol. 5, No. 4, Apr. 1998.
Milani, et al., “On Maximum Achievable Noise Reduction in ANC Systems”, Proceedings of the IEEE International Conference on Acoustics, Speech, and Signal Processing, ICASSP 2010, Mar. 14-19, 2010 pp. 349-352.
Ryan, et al., “Optimum near-field performance of microphone arrays subject to a far-field beampattern constraint”, 2248 J. Acoust. Soc. Am. 108, Nov. 2000.
Cohen, et al., “Noise Estimation by Minima Controlled Recursive Averaging for Robust Speech Enhancement”, IEEE Signal Processing Letters, vol. 9, No. 1, Jan. 2002.
Martin, “Noise Power Spectral Density Estimation Based on Optimal Smoothing and Minimum Statistics”, IEEE Trans. on Speech and Audio Processing, col. 9, No. 5, Jul. 2001.
Martin, “Spectral Subtraction Based on Minimum Statistics”, Proc. 7th EUSIPCO ’94, Edinburgh, U.K., Sep. 13-16, 1994, pp. 1182-1195.
Cohen, “Noise Spectrum Estimation in Adverse Environments: Improved Minima Controlled Recursive Averaging”, IEEE Trans. on Speech & Audio Proc., vol. 11, Issue 5, Sep. 2003.

* cited by examiner

AMBIENT NOISE ROOT MEAN SQUARE (RMS) DETECTOR

FIELD OF THF INVENTION

The present invention relates to an ambient noise Root Mean Square (RMS) level detector. In particular, the present invention is directed toward an improved noise RMS detector that is robust to speech presence, wind noise, and other sudden variations in noise levels.

BACKGROUND OF THF INVENTION

A personal audio device, such as a wireless telephone, includes an adaptive noise canceling (ANC) circuit that adaptively generates an anti-noise signal from a reference microphone signal and injects the anti-noise signal into the speaker or other transducer output to cause cancellation of ambient audio sounds. An error microphone is also provided proximate the speaker to measure the ambient sounds and transducer output near the transducer, thus providing an indication of the effectiveness of the noise canceling. A processing circuit uses the reference and/or error microphone, optionally along with a microphone provided for capturing near-end speech, to determine whether the ANC circuit is incorrectly adapting or may incorrectly adapt to the instant acoustic environment and/or whether the anti-noise signal may be incorrect and/or disruptive and then takes actions in the processing circuit to prevent or remedy such conditions.

Examples of such adaptive noise cancellation systems are disclosed in published U.S. Patent Application 2012/0140943, published on Jun. 7, 2012, and in published U.S. Patent Application 2012/0207317, published on Aug. 16, 2012, both of which are incorporated herein by reference. Both of these references are assigned to the same assignee as the present application and name at least one inventor in common and thus are not prior art to the present application, but are provided to facilitate the understating of ANC circuits as applied in the field of use.

Referring now to FIG. 1, a wireless telephone 10 is illustrated in accordance with an embodiment of the present invention is shown in proximity to a human ear 5. Wireless telephone 10 includes a transducer, such as speaker SPKR that reproduces distant speech received by wireless telephone 10, along with other local audio events such as ring tones, stored audio program material, injection of near-end speech (i.e., the speech of the user of wireless telephone 10) to provide a balanced conversational perception, and other audio that requires reproduction by wireless telephone 10, such as sources from web-pages or other network communications received by wireless telephone 10 and audio indications such as battery low and other system event notifications. A near-speech microphone NS is provided to capture near-end speech, which is transmitted from wireless telephone 10 to the other conversation participant(s).

Wireless telephone 10 includes adaptive noise canceling (ANC) circuits and features that inject an anti-noise signal into speaker SPKR to improve intelligibility of the distant speech and other audio reproduced by speaker SPKR. A reference microphone R is provided for measuring the ambient acoustic environment and is positioned away from the typical position of a user's/talker's mouth, so that the near-end speech is minimized in the signal produced by reference microphone R. A third microphone, error microphone E, is provided in order to further improve the ANC operation by providing a measure of the ambient audio combined with the audio reproduced by speaker SPKR close to ear 5, when wireless telephone 10 is in close proximity to ear 5. Exemplary circuit 14 within wireless telephone 10 includes an audio CODEC integrated circuit 20 that receives the signals from reference microphone R, near speech microphone NS, and error microphone E and interfaces with other integrated circuits such as an RF integrated circuit 12 containing the wireless telephone transceiver.

In general, the ANC techniques measure ambient acoustic events (as opposed to the output of speaker SPKR and/or the near-end speech) impinging on reference microphone R, and by also measuring the same ambient acoustic events impinging on error microphone E, the ANC processing circuits of illustrated wireless telephone 10 adapt an anti-noise signal generated from the output of reference microphone R to have a characteristic that minimizes the amplitude of the ambient acoustic events at error microphone E. Since acoustic path P(z) (also referred to as the Passive Forward Path) extends from reference microphone R to error microphone E, the ANC circuits are essentially estimating acoustic path P(z) combined with removing effects of an electro-acoustic path S(z) (also referred to as Secondary Path) that represents the response of the audio output circuits of CODEC IC 20 and the acoustic/electric transfer function of speaker SPKR including the coupling between speaker SPKR and error microphone E in the particular acoustic environment, which is affected by the proximity and structure of ear 5 and other physical objects and human head structures that may be in proximity to wireless telephone 10, when wireless telephone is not firmly pressed to ear 5.

Such adaptive noise cancellation (ANC) systems may employ a Root Mean Square (rms) detector to detect average background noise levels. Such an RMS detector needs to track background noise levels slowly but not so slowly as to become insensitive to environmental variations. An ideal RMS detector should be robust to speech presence, robust to scratching (contact) on the microphone, robust to wind noise, and a have a low computational complexity. For the purposes of describing the present ambient noise RMS detector, the lower case rms variable is utilized to refer to the prior art techniques and the upper case RMS to represent the corrected signal of the present ambient noise RMS detector, as set forth below. The present ambient noise RMS detector may utilize the prior art rms value in generating the RMS signal.

Perhaps the most well-known background noise estimation method, based on minimum statistics, was the rms detector introduced by Ranier Martin. See, Martin, Ranier, *Noise Power Spectral Density Estimation Based on Optimal Smoothing and Minimum Statistics*, IEEE Transactions on Speech and Audio Processing, Col. 9, No, 5, July 2001, incorporated herein by reference, as well as Martin, Ranier, *Spectral Subtraction Based on Minimum Statistics*, in Proc. $7^{th}$ EUSIPCO '94, Edinburgh, U.K., Sep. 13-16, 1994, pp/. 1182-1195, also incorporated herein by reference. Israel Cohen has made another RMS detector based on the Martin design. See, Cohen, Israel, *Noise Spectrum Estimation in Adverse Environments: Improved Minima Controlled Recursive Averaging*, IEEE Transactions on Speech and Audio Processing, Vol. 11, Issue 5, September 2003, incorporated herein by reference as well as Cohen, Israel, *Noise Estimation by Minima Controlled Recursive Averaging for Robust Speech Enhancement*, IEEE Signal Processing Letters, Vol. 9, No. 1, January 2002, also incorporated herein by reference. Both the Martin and Cohen methods and designs employ a method to track the minimum RMS value. Both methods also use a first-order regressor with a variable smoothing factor.

The Cohen design may be less complex compared and provides better performance compared to the Martin design.

The Cohen design depends on a couple of thresholds and parameters that should be adjusted for different applications. The Cohen design also uses less memory than the Martin design in that previous values of rms are kept to find the minimum value. The problem with the Cohen design is that it is susceptible to non-stationary noise such as spike noise. For example, when used in an adaptive noise cancellation system (ANC) on a cellular phone or the like, spike noise such as wind noise or scratching (user's/talker's hand scratching or rubbing the case) may create spikes to which the Cohen design would over-react. As a result, the performance of an ANC system, for example, in a cellular telephone or the like, may be degraded, as the rms detector over-reacts to these spike noises.

A simple rms detector based on a first order regression may produce an output illustrated in FIG. 2. This first order regression may be calculated as shown in equation (1):

$$\mathrm{rms}(n) = (1-\alpha)\cdot\mathrm{rms}(n-1) + \alpha\cdot|\mathrm{input}(n)| \tag{1}$$

$$\alpha = \begin{cases} \alpha_{att} & |\mathrm{input}| > \mathrm{rms}(n-1) \\ \alpha_{dec} & \text{else} \end{cases}$$

where $\alpha$ represents a smoothing factor, rms(n) represents the rms value for the sample n and input(n) represents the input signal for sample n, and n is a sample integer number. Thus, the rms value in equation (1) is calculated by multiplying a smoothing factor (subtracted from one) times the previous rms value and then adding the absolute value of the input value times this same smoothing factor. The smoothing factor $\alpha$ may be selected from one of two values, $\alpha_{att}$ or $\alpha_{dec}$ depending on whether the absolute value of the input signal is greater or less than the previous rms value.

The problem with such a simple rms detector is that it not only tracks background noise, but also speech, scratch, and wind noise. As illustrated in FIG. 2, the outer darker line 210 represents a speech signal, with occasional spike noise 220 as shown. The lighter line 230 represents the rms signal, calculated with a slow attack and fast decay, as shown in Equation (1). As can be seen in FIG. 2, the rms value 230 calculated using Equation (1) ends up tracking these spike signals 220, which maybe undesirable for an adaptive noise cancellation (ANC) circuit. By tracking the spike signals 220, the ANC circuit may end up generating inappropriate anti-noise, and as a result, create artifacts in the reproduced audio signal for the user.

SUMMARY OF THE INVENTION

The present ambient noise RMS detector represents an improvement over the prior art rms detector from a adaptive or machine learning perspective. The present ambient noise RMS detector uses the concept of a k-NN (classifying using nearest neighbors) algorithm in order to obtain RMS values. The k-nearest neighbor algorithm (k-NN) is a method for classifying objects based on closest training examples in the feature space. k-NN is a type of instance-based learning, or lazy learning where the function is only approximated locally and all computation is deferred until classification. An object is classified by a majority vote of its neighbors, with the object being assigned to the class most common amongst its k nearest neighbors (k is a positive integer, typically small). If k=1, then the object is simply assigned to the class of its nearest neighbor.

The same method can be used for regression, by simply assigning the property value for the object to be the average of the values of its k nearest neighbors. It can be useful to weight the contributions of the neighbors, so that the nearer neighbors contribute more to the average than the more distant ones. (A common weighting scheme is to give each neighbor a weight of 1/d, where d is the distance to the neighbor. This scheme is a generalization of linear interpolation.)

The present invention incorporates a prior art rms detector using first-order regressor with a variable smoothing factor but adds additional features to penalize samples from center of data in order to obtain RMS values. Thus, samples which vary greatly from the background noise levels, such as speech, scratch, and other noise spikes, are dampened in the RMS calculation. However, when background noise increases/decreases (changes in general), the system will track this change in background noise and include that in the calculation of the corrected RMS value.

Output from a prior art rms detector using a first-order regressor with a variable smoothing factor is fed to a minimum tracker, which is also known in the art. The minimum tracker tracks the minimum rms value, $R_{min}$ over time. This revised minimum value is used to compute a normalized distance value d, which represents the ratio expressed as the absolute value of the difference between the previously calculated rms value, and the RMS value calculated in the present ambient noise RMS detector divided by the RMS value calculated by the present ambient noise RMS detector. This value d in turn is used to normalize the smoothing factor $\alpha$ by dividing the smoothing factor by the maximum of d or 1.

Once these values are calculated, a corrected or revised RMS value can be determined as the function of the previous RMS value multiplied by one minus the smoothing factor plus the smooth factor times the minimum rms value to output the corrected RMS for the present ambient noise RMS detector. The rms value may be used to generate a reset signal for the minimum tracker. This reset signal may be operated on an order of 0.1 to 1 seconds and is used to avoid deadlock in the tracker, for example, when the background signal increases over time.

The effect of the present ambient noise RMS detector, as demonstrated in the Figures attached herewith, is to provide a background RMS value which is largely immune from sudden spikes in value, such as due to speech, "scratching" (when a person physically touches the microphone, for example), or wind noise, particularly when compared to the prior art techniques.

While discussed herein in the context of cellular telephones and adaptive noise cancellation circuits used therein, the present ambient noise RMS detector has applications for a number of audio devices and the like. For example, the RMS detector of the present invention may be applied to audio and audio-visual recording equipment, computing devices equipped with microphones, speech recognition systems, speech activated systems (e.g., in automobiles), and even event detectors, such as alarm systems, where it may be desirable to filter background sounds from sudden noises, such as glass-break or speech by intruders. While disclosed in the context of cellular phones and adaptive noise cancellation circuits, the present ambient noise RMS detector should in no way be construed as being limited to that particular application.

DETAILED DESCRIPTION OF THE INVENTION

Figure 1:
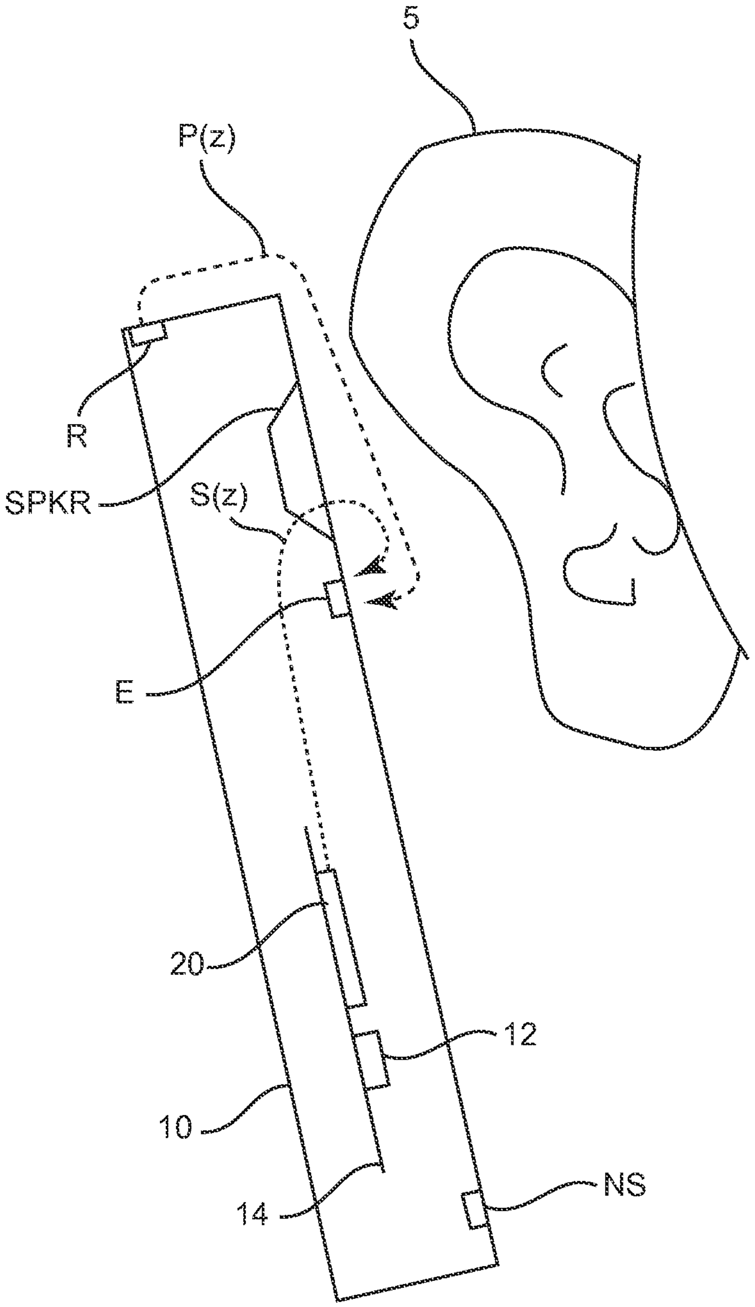
FIG. 1 is a diagram illustrating how dual microphones may be used in an adaptive noise cancellation circuit in a cellular telephone.
Figure 2:
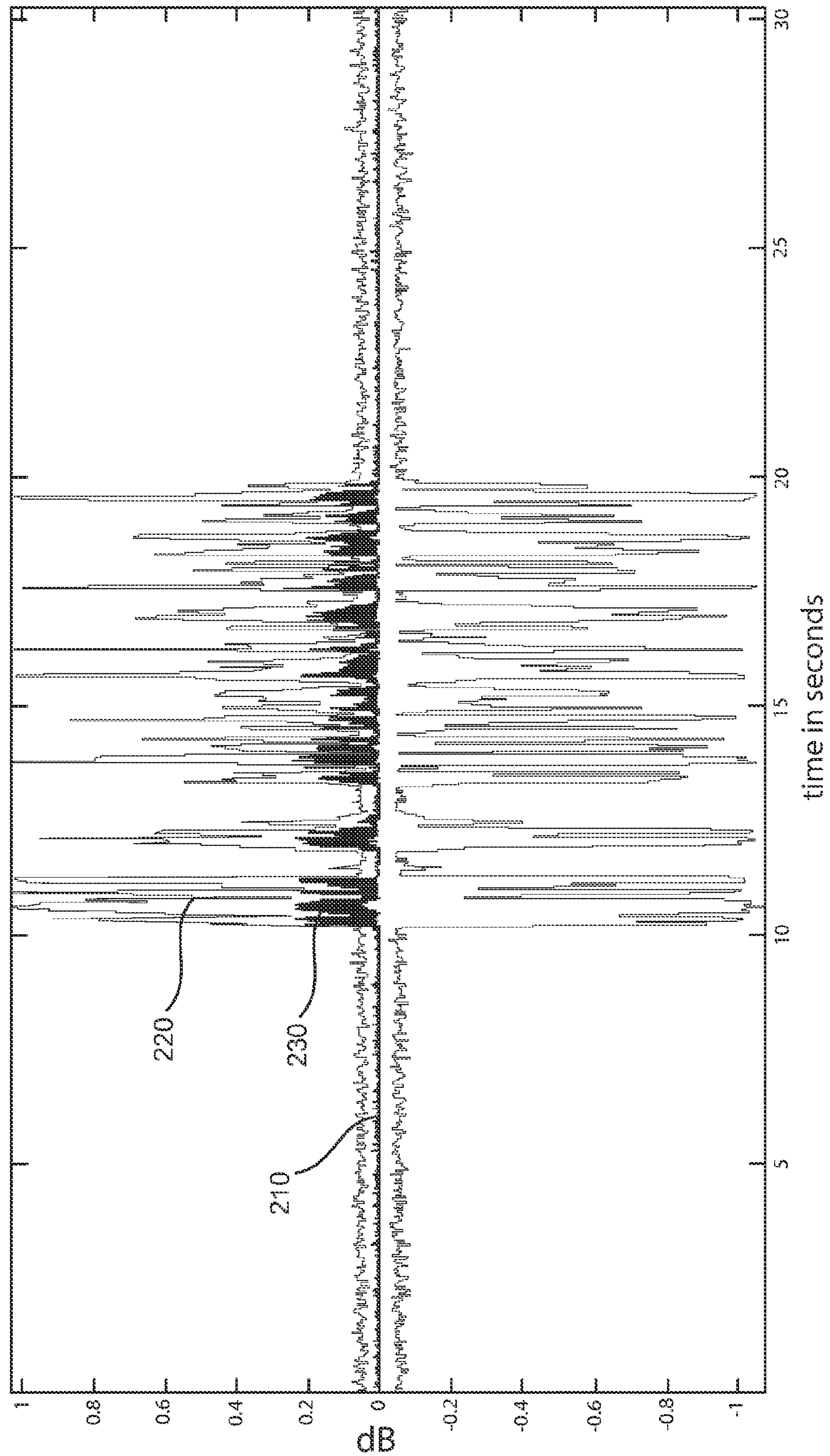
FIG. 2 is a graph illustrating a voice signal with spike components and the resulting rms signal calculation using the techniques of the prior art.
Figure 3:
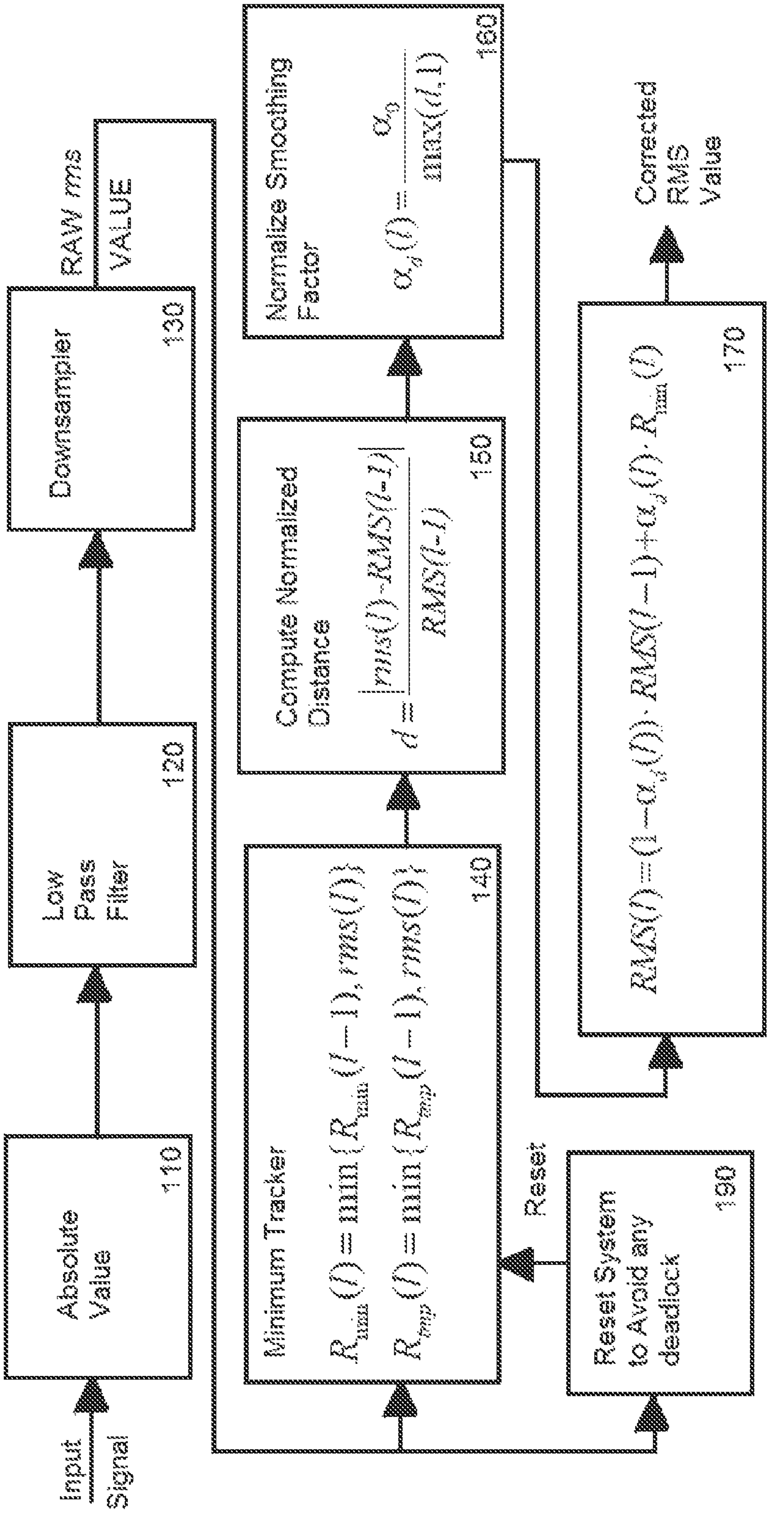
FIG. 3 is a block diagram of an embodiment of the present ambient noise RMS detector.

The present ambient noise RMS detector improves upon the techniques of prior art rms detectors such as taught by Martin and Cohen by using an improved algorithm in the RMS detector. FIG. 3 is a block diagram of the present ambient noise RMS detector. Referring to FIG. 3, a raw rms value is calculated from the input signal using known prior art techniques. Blocks 110, 120, and 130 are elements of a first-order regressor with a variable smoothing factor. The input signal, which in this instance may be a background noise signal with speech, is fed to block 110 where the absolute value of the signal is taken. This absolute value signal in turn is fed to low-pass-filter 120 and then to downsampler 130. The net effect is to output a raw rms value such as described above in connection with Equation (1). As these first three elements of the block diagram are known in the art, they will not be described in further detail.

Figure 4:
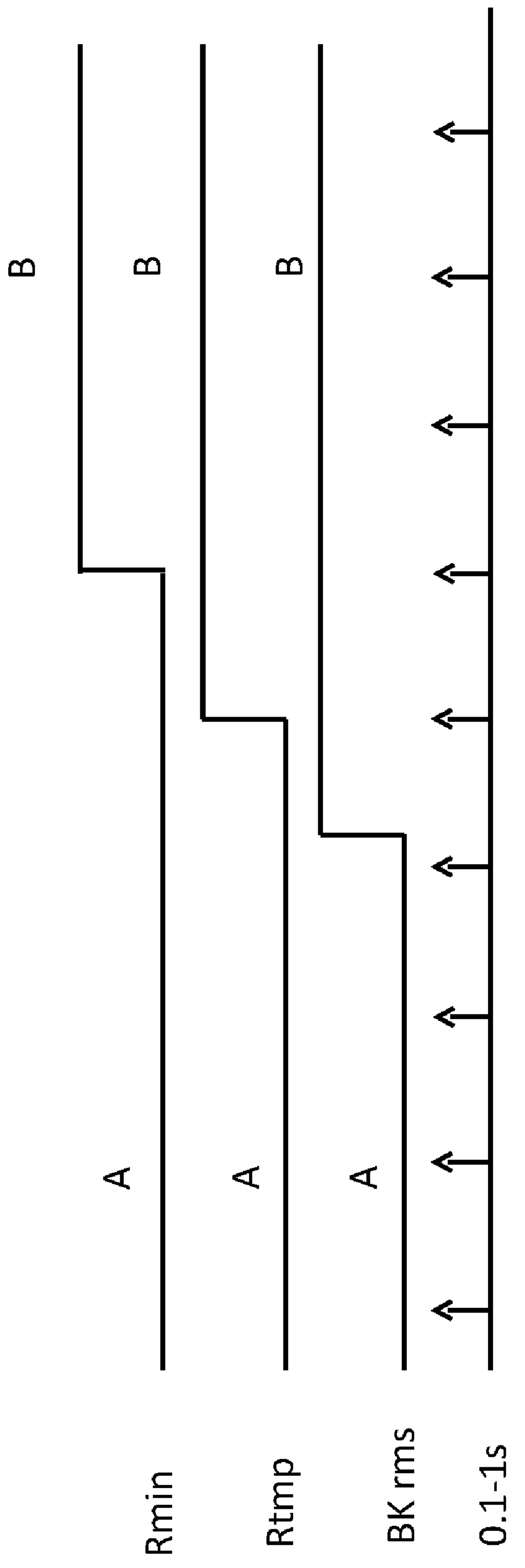
FIG. 4 is a graph illustrating how the minimum RMS value is tracked.
Figure 5A:
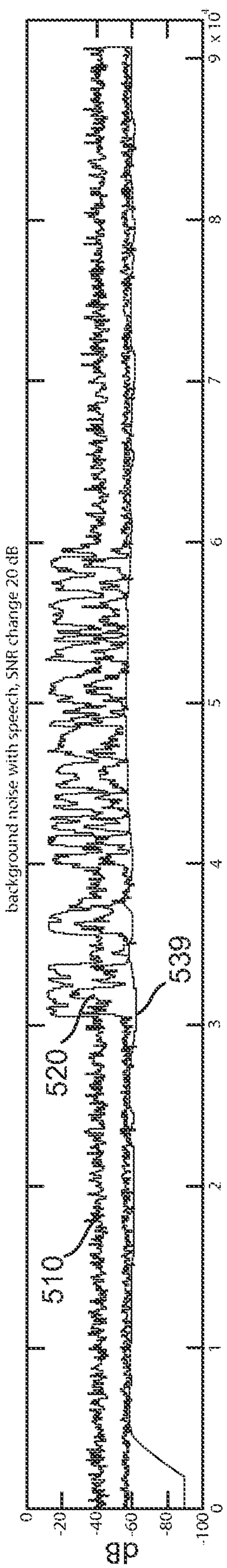
FIG. 5A is a graph illustrating instantaneous RMS and ambient RMS for a sample input signal comprising background noise with speech.
Figure 5B:
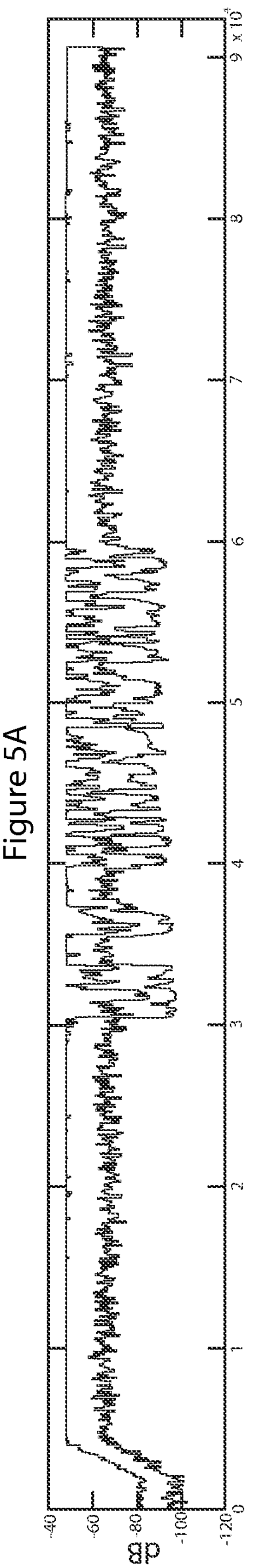
FIG. 5B is a graph illustrating the value a calculated from the instantaneous RMS according to equation (7) and block 160 in FIG. 3.
Figure 5C:
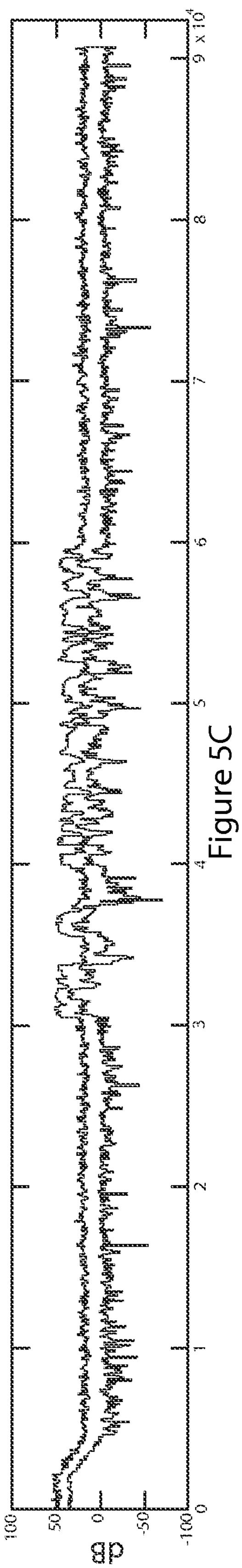
FIG. 5C is a graph illustrating the calculation of distance value d according to equation (6) and block 150 of FIG. 3.
Figure 5D:
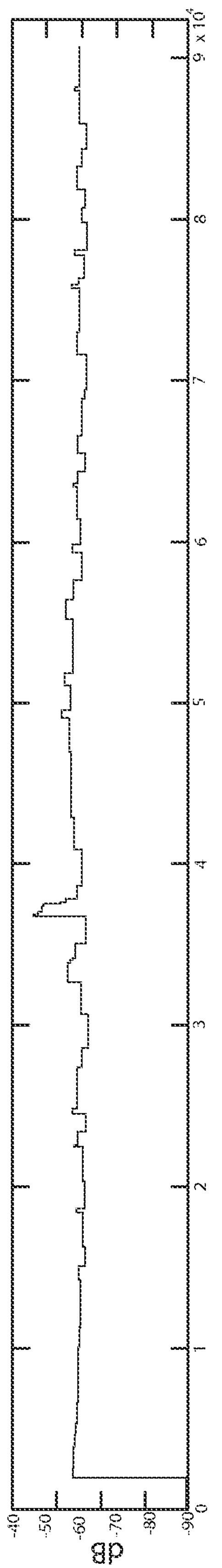
FIG. 5D is a graph illustrating the value of resulting $R_{min}$ as determined from equation (2) below and block 140 of FIG. 3.

Both the Martin and Cohen methods and designs discussed above also employ a method to track the minimum rms value, Rmin, and tracking the minimum rms value is one function of the present ambient noise RMS detector. Speech, scratching (physical contact) on the microphone, wind noise, and any spike noise are all unlikely background noise in that they are not always present but appear as noise spikes in the ambient noise signal. This fact can be leveraged by comparing a short-term minimum RMS value with a long-term one to determine whether such a spike has occurred. FIG. 4 is a graph illustrating how the minimum RMS value is tracked. For every instantaneous transition, short-term rms values $R_{min}$ and $R_{tmp}$ may be calculated as:

$$\begin{cases} R_{min}(l) = \min\{R_{min}(l-1), \text{rms}(l)\} \\ R_{tmp}(l) = \min\{R_{tmp}(l-1), \text{rms}(l)\} \end{cases} \quad (2)$$

where $R_{min}$ is the minimum rms value over time, and $R_{tmp}$ is a temporary minimum rms value to track background noise changes.

The reset mechanism for the ambient noise detector is then calculated simultaneously with equation (2). This reset mechanism calculates a long-term rms value every 0.1 to 1 seconds for values $R_{min}$ and $R_{tmp}$ as:

$$\begin{cases} R_{min}(l) = \min\{R_{tmp}(l-1), \text{rms}(l)\} \\ R_{tmp}(l) = \text{rms}(l) \end{cases} \quad (3)$$

As illustrated in FIG. 4, this approach has the effect of delaying the change in minimum RMS value $R_{min}$ in response to changes in the base rms calculation of background noise rms value BK rms. As the background rms signal increases from level A to level B, the temporary minimum value $R_{tmp}$, calculated according to Equations (2) and (3) above, rises from level A to level B, delayed over time, as illustrated in FIG. 4. The value of minimum RMS value $R_{min}$ rises from level A to level B delayed even further (the same is true for decreasing from level B to level A), as illustrated in FIG. 4. Although FIG. 4 only shows the case where level A is less than level B, the same effect occurs when level A is greater than level B as well.

In Cohen's method from this minimum RMS value $R_{min}$ calculation, it may be possible to calculate RMS using a first approach based on the probability of the presence of disturbance in the background noise signal:

$$\text{RMS}(l)=\alpha_d(l)\cdot\text{RMS}(l-1)+(1-\alpha_d(l))\cdot|\text{input}|$$

$$\alpha_d(l)=\beta+(1-\beta)*p(l)$$

$$p(l)\rightarrow 1\rightarrow\alpha_d(l)\rightarrow 1 \quad (4)$$

Here, p(1) is the probability of the presence of any disturbance (e.g., speech presence), and as this probability approaches one, the smoothing factor value approaches one. This probability value may be calculated as follows:

$$p(l) = \alpha_p \cdot p(l-1) + (1-\alpha_p)\cdot I(l) \quad (5)$$

$$I(l) = \begin{cases} 1 & \frac{\text{rms}(l)}{R_{min}(l)} > \delta \\ 0 & \text{else} \end{cases}$$

where $\alpha_p$ represents a smoothing factor, and δ is the threshold which determines the level of any disturbance compared to Rmin(1).

One problem with this RMS tracking technique is that there are too many parameters to adjust. In addition, its reaction time is slow and is not robust. Speech rms can leak to the background RMS value. While the prior art Cohen design has additional components to make the system more robust, the system still suffers from these same operational problems. Thus, the present ambient noise RMS detector improves on the algorithms of equations (4) and (5) to provide an improved minimum RMS value $R_{min}$ tracking technique and RMS calculation.

Referring back to FIG. 3, in the present ambient noise RMS detector, the output raw rms value is then fed to a minimum tracker 140. In block 150, the normalized distance d between the current RMS and the instantaneous rms value is computed as:

$$d=\frac{|\text{rms}(l)-\text{RMS}(l-1)|}{\text{RMS}(l-1)} \tag{6}$$

where rms(l) is a raw rms value for sample l and RMS(l−1) is a previous corrected RMS value.

In block 160, the smooth factor is normalized with this distance d:

$$\alpha_d(l)=\frac{\alpha_0}{\max(d,1)} \tag{7}$$

where $\alpha_d$(l) represents the normalized smoothing factor for sample l and $\alpha_0$ represents a standard smoothing factor, and max(d,1) is the maxima of the normalized distance and 1. The normalized smoothing factor is then fed to block 170:

$$\text{RMS}(l)=(1-\alpha_d(l))\cdot\text{RMS}(l-1)+\alpha_d(l)\cdot R_{min}(l) \tag{8}$$

where RMS(l) is the corrected RMS value, and RMS(l−1) is a previous corrected RMS value, $\alpha_d$(l) represents the normalized smoothing factor for sample l as calculated in equation (7) and minimum RMS value $R_{min}$ is the minimum rms value calculated in equation (3).

The raw rms value is also fed to block 190, which then generates a reset signal Reset. The reset signal Reset is triggered in order to reset the system to avoid any deadlock, for example, when the background noise signal rises gradually. The reset mechanism is shown in equation (3) as discussed previously.

Figure 6:
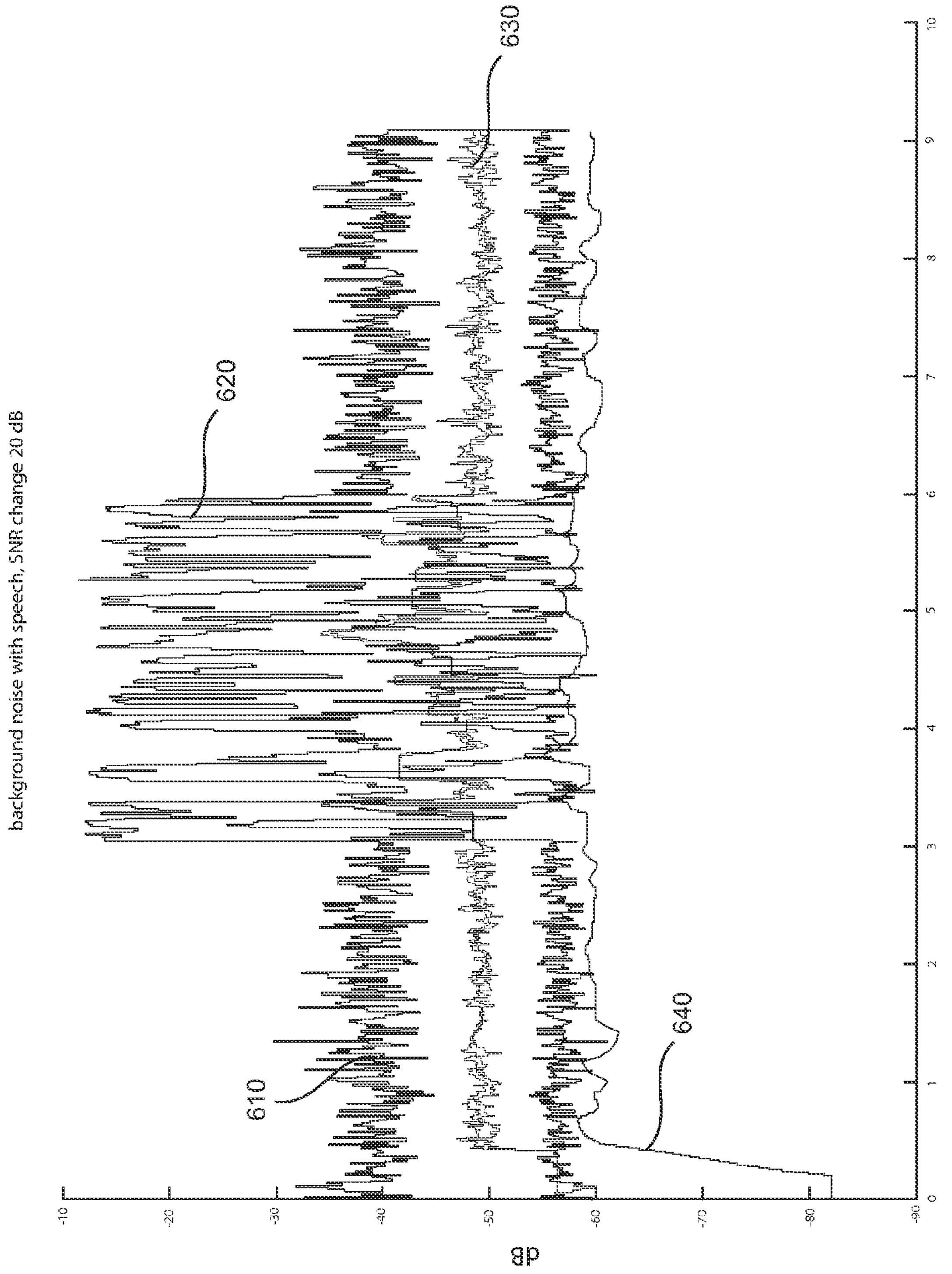
FIG. 6 is a graph comparing a signal containing background noise with speech, showing a comparison between the old method of the prior art and the technique and apparatus of the present ambient noise RMS detector.

FIGS. 4-6 are graphs illustrating the operation of the present ambient noise RMS detector. In FIG. 5A, the instantaneous RMS and ambient RMS are shown for a sample input signal comprising background noise with speech. In FIG. 5A, the background noise appears as the baseline signal 510 and the speech portion appears in the center as the elevated portion 520. The instantaneous rms appears as the thick line (510, 520), while the final calculated ambient RMS appears as the thin line 530 below the thick line. In FIG. 5B, the value a is shown calculated from the instantaneous rms according to equation (7) above and block 160 in FIG. 3. FIG. 5C shows the calculation of d according to equation (6) above and block 150 of FIG. 3. FIG. 5D shows the resulting minimum RMS value $R_{min}$ as determined from equation (8) above and block 170 of FIG. 3.

FIG. 6 is a graph comparing a signal containing background noise with speech, showing a comparison between the old method of the prior art and the technique and apparatus of the present invention. The rms(l) signal is shown as the wide dark signal 610 in FIG. 6 with the speech disturbance 620 in the central portion. The rms calculation using the prior art method is shown as the wavy light line 630 in the center of that signal. As shown in FIG. 6, spikes occur in this signal in relationship to the source signal. As illustrated in FIG. 6, the prior art technique is sensitive to speech in the background noise signal. The bottom line 640 represents the RMS value calculated using the technique of the present ambient noise RMS detector. As illustrated in FIG. 6, the technique of the present ambient noise RMS detector is far less responsive to transient spikes than the prior art technique.

Figure 7:
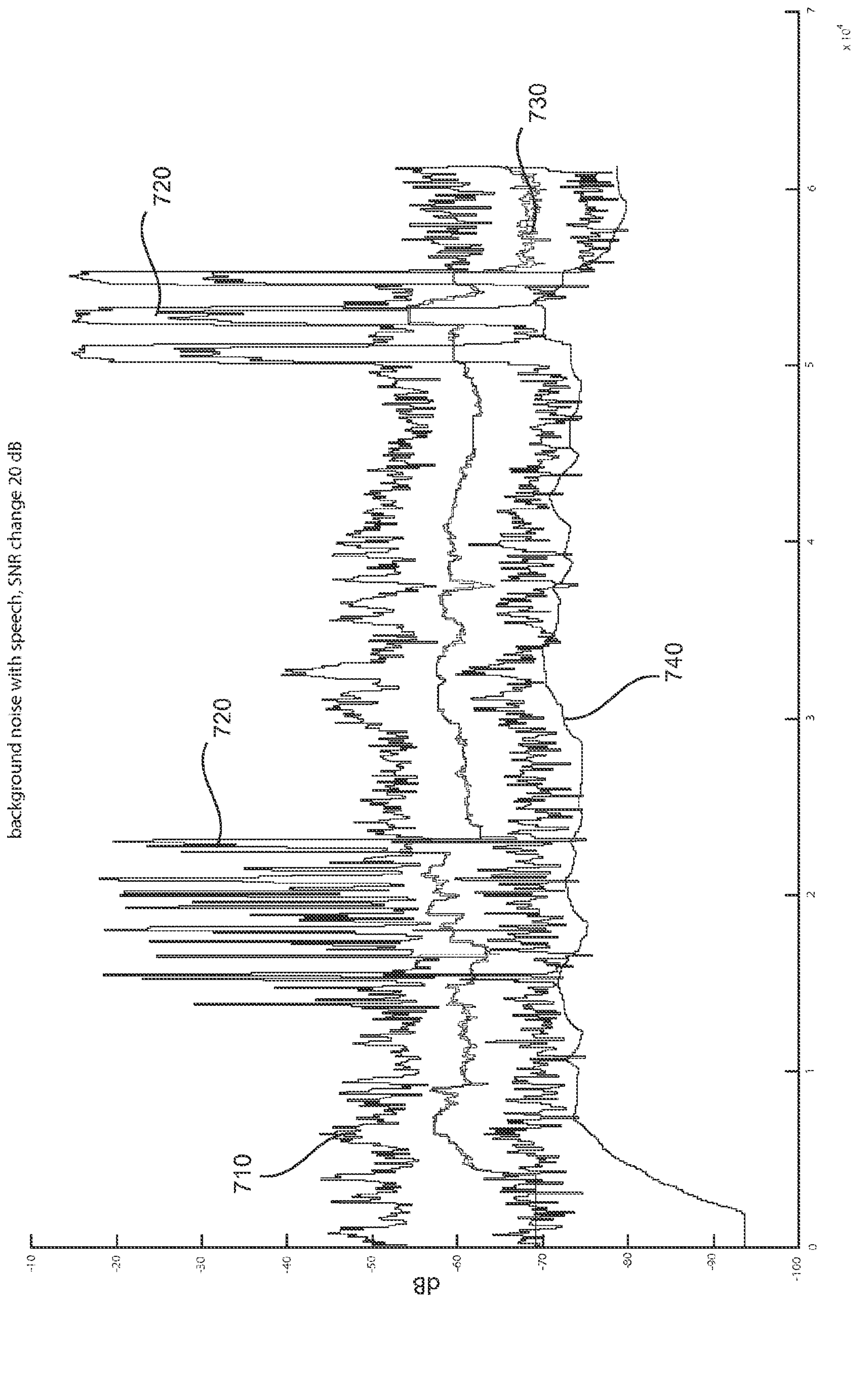
FIG. 7 is a graph comparing a signal containing background noise with a "scratch" signal in the background noise, showing a comparison between the old method of the prior art and the technique and apparatus of the present ambient noise RMS detector.

FIG. 7 is a graph comparing a signal containing background noise 710 with a scratch signal 720 in the background noise, and showing a comparison between the old method of the prior art and the technique and apparatus of the present ambient noise RMS detector. The scratch signals 720 are more pronounced than the speech signals 620 of FIG. 6. The rms(l) signal is shown as the wide dark signal 710 in FIG. 7. The rms calculation using the prior art method is shown as the wavy light line 730 in the center of that signal. As shown in FIG. 7, spikes 720 occur in this signal in relationship to the source signal 710. The bottom line 740 represents the RMS value calculated using the technique for the present ambient noise RMS detector. As illustrated in FIG. 7, the technique for the present ambient noise RMS detector is far less responsive to transient spikes than the prior art technique.

The present ambient noise RMS detector has thus been proven to more accurately calculate RMS values from an input signal, while being relatively immune to speech, wind noise, scratch, and other signal spikes. This improved RMS value calculation provides a better input value for an adaptive noise cancellation (ANC) circuit for use, for example, in a cellular telephone or the like. This improved value in turn allows for better operation of the ANC circuit, creating fewer artifacts or dropped out audio (e.g., due to the ANC circuit overcompensating and muting desired audio signals) in the audio output to the user.

While embodiments of the present ambient noise RMS detector have been disclosed and described in detail herein, it may be apparent to those skilled in the art that various changes in form and detail may be made therein without departing from the spirit and scope thereof.

I claim:

1. A root mean square (RMS) detector detecting an RMS level of a background noise input signal while being substantially immune to voice, wind, scratch sounds, and any spike noise, the RMS detector comprising:

a raw rms detector receiving a background noise input signal and outputting a raw rms value;

a minimum rms tracker receiving the raw rms value and tracking a minimum rms value of the raw rms value;

a normalized distance tracker receiving the minimum rms value and calculating a distance value between the minimum rms value and a previous corrected RMS value;

a normalized smoothing factor calculator normalizing a smoothing factor by dividing the smoothing factor by a maximum of the distance value or 1; and an RMS value calculator determining a corrected RMS value from the minimum rms value, a previous corrected RMS value, and the normalized smoothing factor, and outputting a corrected RMS value.

2. The RMS detector of claim 1, further comprising a reset generator receiving the raw rms value and generating a reset signal to the minimum rms tracker to reset the minimum rms tracker when the raw rms value changes in value over time to prevent the minimum rms tracker from locking up.

3. The RMS detector of claim 2, wherein the raw rms detector determines raw rms by adding a previous raw rms value to an input signal value.

4. The RMS detector of claim 3, wherein the absolute value of the input signal value is multiplied by a smoothing factor prior to being added to the previous raw rms value.

5. The RMS detector of claim 4, wherein the previous rms value is multiplied by one minus the smoothing factor prior to being added to the input signal value.

6. The RMS detector of claim 5 wherein the smoothing factor is selected from one of two predetermined values depending on whether the absolute value of the input signal is greater or less than the previous raw rms value.

7. The RMS detector of claim 2, where in the raw rms detector determines raw rms by:

$$\mathrm{rms}(n) = (1-\alpha)\cdot \mathrm{rms}(n-1) + \alpha\cdot|\mathrm{input}(n)|$$

$$\alpha = \begin{cases} \alpha_{att} & |\mathrm{input}| > \mathrm{rms}(n-1) \\ \alpha_{dec} & \text{else} \end{cases}$$

where $\alpha$ represents a smoothing factor, rms(n) represents the raw rms value for the sample n and input(n) represents the input signal for sample n, and an n sample number and a smoothing factor $\alpha$ may be selected from one of two values, $\alpha_{att}$ or $\alpha_{dec}$ depending on whether the absolute value of the input signal is greater or less than the previous raw rms value.

8. The RMS detector of claim 2, wherein the minimum tracker determines a short-term minimum rms value by taking the minimum of the previous minimum rms value and the current raw rms value, and for every 0.1 to 1 seconds, calculating a long-term minimum rms value as the minimum of a previous temporary minimum rms value and the present raw rms value to reset the detector, where the temporary rms value tracks background noise changes.

9. The RMS detector of claim 8, wherein the minimum tracker sets the temporary rms value to a current raw rms value and the minimum rms value to a minimum of a previous temporary rms value and the current raw rms value at every 0.1 to 1 seconds to more closely track the minimum rms value.

10. The RMS detector of claim 9, wherein the normalized distance is calculated by dividing the difference between the current raw rms value and the previous corrected RMS value by the previous corrected RMS value.

11. The RMS detector of claim 10, wherein the normalized smoothing factor is calculated by dividing a standard predetermined smoothing factor by the maxima of the normalized distance and one.

12. The RMS detector of claim 11, wherein the corrected RMS value output by the RMS detector is calculated by the sum of the normalized smoothing factor times the minimum rms value determined by the minimum rms value tracker and the product of the previous corrected RMS value times one minus the normalized smoothing factor.

13. The RMS detector of claim 2, wherein the minimum tracker determines the minimum rms value by taking the minimum of the previous minimum rms value and the current raw rms value $$\begin{cases} R_{min}(l) = \min\{R_{min}(l-1), \mathrm{rms}(l)\} \\ R_{tmp}(l) = \min\{R_{tmp}(l-1), \mathrm{rms}(l)\} \end{cases}$$

and for every 0.1 to 1 seconds, a long-term rms value $R_{min}$ and $R_{tmp}$ may be calculated as:

$$\begin{cases} R_{min}(l) = \min\{R_{tmp}(l-1), \mathrm{rms}(l)\} \\ R_{tmp}(l) = \mathrm{rms}(l) \end{cases}$$

to reset the detector, where $R_{min}$ is the minimum rms value over time, and $R_{tmp}$ is a temporary minimum rms value to track background noise changes.

14. The RMS detector of claim 13, wherein the normalized distance d is calculated by:

$$d = \frac{|\mathrm{rms}(l) - \mathrm{RMS}(l-1)|}{\mathrm{RMS}(l-1)}$$

where rms(l) is a raw rms value for sample l and RMS(l−1) is a previous corrected RMS value.

15. The RMS detector of claim 14, wherein the normalized smoothing factor is calculated by:

$$\alpha_d(l) = \frac{\alpha_0}{\max(d, 1)}$$

where $\alpha_d(l)$ represents the normalized smoothing factor for sample l and $\alpha_0$ represents a standard smoothing factor, and max(d,1) is the maxima of the normalized distance and 1.

16. The RMS detector of claim 15, wherein the corrected RMS value output by the RMS detector is calculated by:

$$\mathrm{RMS}(l)=(1-\alpha_d(l))\cdot \mathrm{RMS}(l-1)+\alpha_d(l)\cdot R_{min}(l)$$

where RMS(l) is the corrected RMS value, and RMS(l−1) is a previous corrected RMS value, $\alpha_d(l)$ represents the normalized smoothing factor for sample l, determined by the normalized smoother factor calculator, and $R_{min}$ is the minimum rms value determined by the minimum rms value tracker.

17. In an RMS detector, a method of detecting RMS level of a background noise input signal while being substantially immune to voice, scratch, wind sounds, and any spike noise, the method comprising:

generating in an initial RMS detector receiving a background noise input signal, a raw rms value;

tracking in a minimum rms tracker receiving the raw rms value, a minimum rms value of the raw rms value;

calculating in a normalized distance tracker receiving the minimum rms value, a distance value between the minimum rms value and a previous corrected RMS value;

normalizing, in a normalized smoothing factor calculator, a smoothing factor by dividing the smoothing factor by a maximum of the distance value or 1; and calculating in an RMS value calculator, a corrected RMS value by determining a corrected RMS value from the minimum rms value, a previous corrected RMS value, and the normalized smoothing factor.

18. The method of claim 17, further comprising:

generating in a reset generator receiving the raw rms value, a reset signal to the minimum rms tracker to reset the minimum rms tracker when the raw rms value changes in value over time to prevent the minimum rms tracker from locking up.

19. The method of claim 18, wherein the raw rms detector determines raw rms by adding a previous raw rms value to an input signal value.

20. The method of claim 19, wherein the absolute value of the input signal value is multiplied by a smoothing factor prior to being added to the previous raw rms value.

21. The method of claim 20, wherein the previous raw rms value is multiplied by one minus the smoothing factor prior to being added to the input signal value.

22. The method of claim 21, wherein the smoothing factor is selected from one of two predetermined values depending on whether the absolute value of the input signal is greater or less than the previous raw rms value.

23. The method of claim 18, where in the raw rms detector determines raw rms by:

$$\text{rms}(n) = (1-\alpha)\cdot\text{rms}(n-1) + \alpha\cdot|\text{input}(n)|$$

$$\alpha = \begin{cases} \alpha_{att} & |\text{input}| > \text{rms}(n-1) \\ \alpha_{dec} & \text{else} \end{cases}$$

where α represents a smoothing factor, rms(n) represents the rms value for the sample n and input(n) represents the input signal for sample n, and an n sample number and a smoothing factor α may be selected from one of two values, $\alpha_{att}$ or $\alpha_{dec}$ depending on whether the absolute value of the input signal is greater or less than the previous raw rms value.

24. The method of claim 18, wherein the minimum tracker determines a short-term minimum rms value by taking the minimum of the previous minimum rms value and the current raw rms value, and for every 0.1 to 1 seconds, calculating a long-term minimum rms value as the minimum of a previous temporary minimum rms value and the present raw rms value to reset the detector, where the temporary rms value tracks background noise changes.

25. The method of claim 24, wherein the minimum tracker sets the temporary rms value to a current raw rms value and the minimum rms value to a minimum of a previous temporary rms value and the current raw rms value at every 0.1 to 1 seconds to more closely track the minimum rms value.

26. The method of claim 25, wherein the normalized distance is calculated by dividing the difference between the current raw rms value and the previous corrected RMS value by the previous corrected RMS value.

27. The method of claim 26, wherein the normalized smoothing factor is calculated by dividing a standard predetermined smoothing factor by the maxima of the normalized distance and one.

28. The method of claim 27, wherein the corrected RMS value output by the RMS detector is calculated by the sum of the normalized smoothing factor times the minimum rms value determined by the minimum rms value tracker, and the product of the previous corrected RMS value times one minus the normalized smoothing factor.

29. The method of claim 18, wherein the minimum tracker determines the minimum rms value by taking the minimum of the previous minimum rms value and the current raw rms value $$\begin{cases} R_{min}(l) = \min\{R_{min}(l-1), \text{rms}(l)\} \\ R_{tmp}(l) = \min\{R_{tmp}(l-1), \text{rms}(l)\} \end{cases}$$

and for every 0.1 to 1 seconds, a long-term rms value $R_{min}$ and $R_{tmp}$ may be calculated as:

$$\begin{cases} R_{min}(l) = \min\{R_{tmp}(l-1), \text{rms}(l)\} \\ R_{tmp}(l) = \text{rms}(l) \end{cases}$$

to reset the detector, where $R_{min}$ is the minimum rms value over time, and $R_{tmp}$ is a temporary minimum rms value to track background noise changes.

30. The method of claim 29, wherein the normalized distance d is calculated by:

$$d = \frac{|\text{rms}(l) - \text{RMS}(l-1)|}{\text{RMS}(l-1)}$$

where rms(l) is a raw rms value for sample l and RMS(l−1) is a previous corrected RMS value.

31. The RMS detector of claim 30, wherein the normalized smoothing factor is calculated by:

$$\alpha_d(l) = \frac{\alpha_0}{\max(d, 1)}$$

where $\alpha_d$(l) represents the normalized smoothing factor for sample l and $\alpha_0$ represents a standard smoothing factor, and max(d,1) is the maxima of the normalized distance and 1.

32. The RMS detector of claim 31, wherein the corrected RMS value output by the RMS detector is calculated by:

$$\text{RMS}(l) = (1-\alpha_d(l))\cdot\text{RMS}(l-1) + \alpha_d(l)\cdot R_{min}(l)$$

where RMS(l) is the corrected RMS value, and RMS(l−1) is a previous corrected RMS value, $\alpha_d$(l) represents the normalized smoothing factor for sample l, determined by the normalized smoother factor calculator, and $R_{min}$ is the minimum rms value determined by the minimum rms value tracker.

* * * * *